US011284546B2

(12) United States Patent
Judy

(10) Patent No.: US 11,284,546 B2
(45) Date of Patent: *Mar. 22, 2022

(54) FARADAY BAG WITH MAGNETIC CLOSURE SYSTEM

(71) Applicant: Merakai, LLC, Santa Barbara, CA (US)

(72) Inventor: Ryan Judy, Santa Barbara, CA (US)

(73) Assignee: Merakai, LLC, Santa Barbara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/920,699

(22) Filed: Jul. 4, 2020

(65) Prior Publication Data

US 2021/0105916 A1     Apr. 8, 2021

Related U.S. Application Data

(63) Continuation of application No. 16/246,452, filed on Jan. 11, 2019, now Pat. No. 10,709,044.

(51) Int. Cl.
    *H05K 9/00*          (2006.01)

(52) U.S. Cl.
    CPC ......... *H05K 9/0043* (2013.01); *H05K 9/0009* (2013.01); *H05K 9/0015* (2013.01); *H05K 9/0094* (2013.01)

(58) Field of Classification Search
CPC ... H04M 1/0214; H04M 1/0245; H04M 1/185
See application file for complete search history.

(56) References Cited

U.S. PATENT DOCUMENTS 3,889,043 A    6/1975   Ducros
4,126,168 A    11/1978   Ganz
(Continued)

FOREIGN PATENT DOCUMENTS

CN          204146519 U     2/2015

OTHER PUBLICATIONS

Title: RFID key fob pouch—car key signal blocking bag—protect against signal relaying—keyless entry systems—Faraday cage; URL: http://www.ibc-groups.com/45538/rfid-key-fob-pouch-car-key-signal-blocking-bag-protect-again; Accessed Aug. 31, 2018.
(Continued)

*Primary Examiner* — Abhishek M Rathod
(74) *Attorney, Agent, or Firm* — Lance M. Pritikin

(57) ABSTRACT

An exemplary faraday bag with magnetic closure system includes an actuatable closure section defined between a shielding compartment and an access mouth. The closure section preferably includes a retention segment, a distal flap segment, and an intermediate flap segment therebetween. Base magnets are disposed within the retention segment and a first panel of the bag. Flap magnets are disposed within the distal flap segment and a second panel of the bag. When the closure section is in open configuration, the flap magnets are substantially out of attractive magnetic engagement with respective base magnets, and the shielding compartment is accessible from an ambient environment through the access mouth. When the closure section is in closed configuration, the flap and retention segments are folded with respect to one another, the flap magnets are in attractive magnetic engagement with respective base magnets, and the access mouth is thereby retained in an RF-sealed configuration.

1 Claim, 8 Drawing Sheets

(56) References Cited

U.S. PATENT DOCUMENTS

| | | | |
|---|---|---|---|
| 4,408,643 | A | 10/1983 | Laske |
| 9,460,309 | B2 | 10/2016 | Zar et al. |
| 2007/0044877 | A1 | 3/2007 | Davidoff |
| 2012/0061134 | A1 | 3/2012 | Kennedy |
| 2012/0128273 | A1 | 5/2012 | Lytle |
| 2012/0195530 | A1 | 8/2012 | Kennedy |
| 2013/0243354 | A1 | 9/2013 | Lytle |
| 2013/0277101 | A1 | 10/2013 | Judy |
| 2014/0009004 | A1 | 1/2014 | Schroeder |
| 2014/0361142 | A1 | 12/2014 | Rohrback |
| 2014/0366250 | A1 | 12/2014 | Barone et al. |
| 2015/0047105 | A1 | 2/2015 | Fonzo |
| 2015/0052617 | A1 | 2/2015 | Zar |
| 2015/0053581 | A1 | 2/2015 | Miller |
| 2015/0108186 | A1* | 4/2015 | Law .............. A45C 11/00 224/191 |
| 2016/0007121 | A1 | 1/2016 | Hung et al. |
| 2017/0066559 | A1 | 3/2017 | Kim et al. |
| 2018/0220757 | A1 | 8/2018 | Brundage |

OTHER PUBLICATIONS

Silent pocket large faraday bag cage cell phone sleeve pouch—blocks all wireless signals; URL: https://www.amazon.com/Silent-Pocket-Medium-Faraday-Sleeve/dp/B017VOS0FE; Accessed Aug. 31, 2018.

* cited by examiner

FARADAY BAG WITH MAGNETIC CLOSURE SYSTEM

RELATED APPLICATIONS

This application is a continuation of U.S. patent application Ser. No. 16/246,452 filed on Jan. 11, 2019, now U.S. Pat. No. 10,709,044.

TECHNICAL FIELD

The present disclosure relates generally to the field of electromagnetic shielding enclosures. More particularly, the present disclosure relates to closure systems for RF-shielded enclosures.

BACKGROUND

Most conventional faraday bags on the market use hook-and-loop strip closures. Hook-and-loop strips are cheap to produce, adequate for most uses, and holds the faraday bag together tightly so RF signal does not leak. FIG. 1 illustrates a typical conventional faraday bag 200 with hook-and-loop closure system. There could be a hook fabric strip 202 on one side of the bag, and a loop fabric strip 204 on the opposing side. The mouth of the bag could roll over twice so the hook strip connects with the loop strip and holds the bag closed.

Although the hook-and-loop faraday bag closure is prevalent, it does have downsides. For example, the hook-and-loop closure can be slow to open and close, may be painful on fingers, and may degrade over time due to wear and tear. Additionally, forensic investigators often use hard-sided RF enclosures (as shown, for example, at 206 in FIG. 12, for example) which may contain conductive gloves (as shown, for example, at 210 in FIG. 12) as part of the enclosure. These conductive gloves are typically made with a soft conductive fabric that can be susceptible to damage through scoring and abrasion. A complaint from users of these enclosures has been the degradation of the conductive gloves by way of opening and closing faraday bags while hands are inside of the gloves—an operation that must occur when a closed faraday bag has been introduced inside of the enclosure. Until now a solution for these problems has not existed, and users of conventional faraday bags have generally been left to contend with the downsides of the hook-and loop-closure.

SUMMARY

Certain deficiencies of the prior art may be overcome by the provision of one or more embodiments of a faraday bag with magnetic closure system in accordance with the present disclosure.

BRIEF DESCRIPTION OF THE DRAWINGS

Further advantages of the present invention may become apparent to those skilled in the art with the benefit of the following detailed description of the preferred embodiments and upon reference to the accompanying drawings in which.

DETAILED DESCRIPTION OF THE PREFERRED EMBODIMENTS

Figure 1:
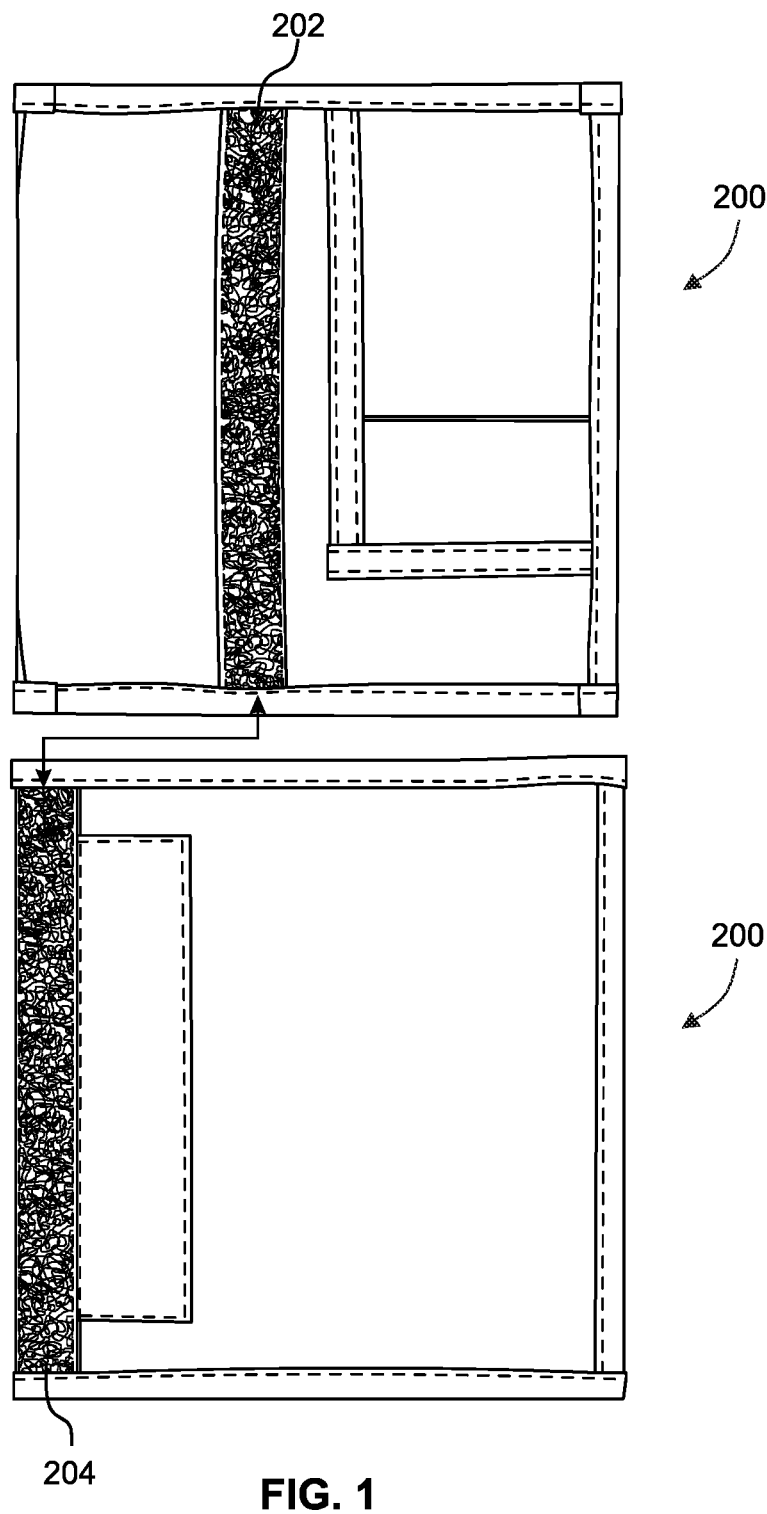
FIG. 1 is a diagrammatic perspective view of a prior art faraday pouch wherein the foldable closure section is securable by way of complementary hook-and-loop fastener strips.

Referring now to the drawings, like reference numerals designate identical or corresponding features throughout the several views.

Features of particular preferred embodiments of a faraday bag with magnetic closure system in accordance with the present disclosure are disclosed herein. However, alternate embodiments of the faraday bag may be constructed with fewer or more features and components than those shown and described in connection with the illustrated embodiments.

Example embodiments of a faraday bag with magnetic closure system in accordance with the present disclosure are shown generally at 100, with the magnetic closure system in particular being shown at 102. Referring to FIGS. 2-5, a faraday bag 100 with magnetic closure system 102 may comprise a first panel element 104, a second panel element 106, a closure section 116, a plurality of base magnets 124 and a multiplicity of flap magnets 126.

Figure 3:
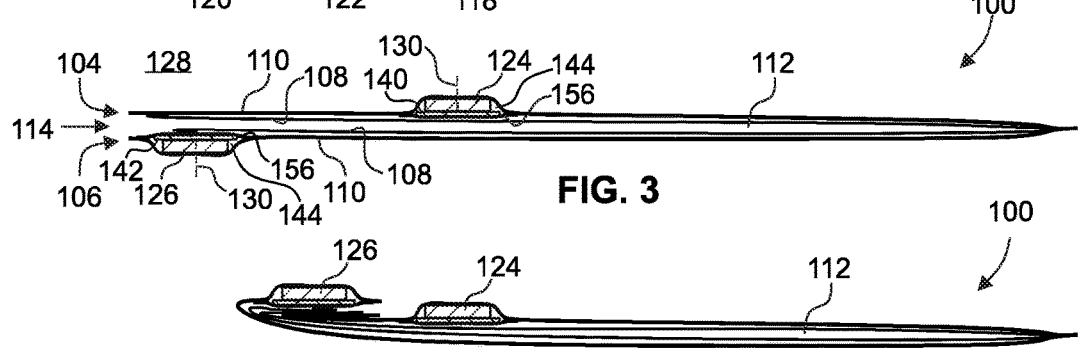
FIG. 3 is a diagrammatic cross-sectional view taken along lines 3-3 in FIG. 2, showing the closure section in an open configuration with the shielding compartment being accessible from (e.g., in communication with) an ambient environment by way of the access mouth.
Figure 4:
FIG. 4 is a further diagrammatic cross-sectional view taken along lines 3-3 in FIG. 2, but wherein the distal flap is folded with respect to the intermediate flap segment.
Figure 7:
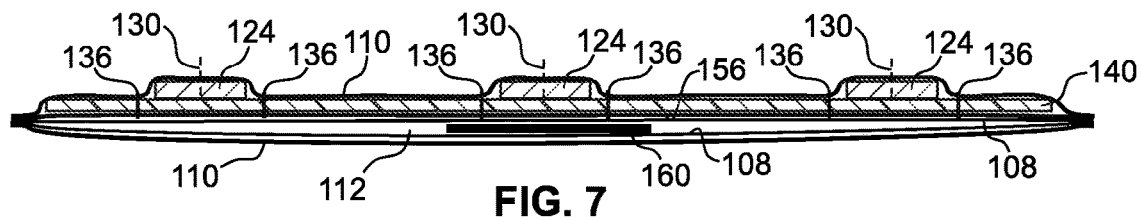
FIG. 7 is a diagrammatic cross-sectional view taken along lines 7-7 in FIG. 6.
Figure 8:
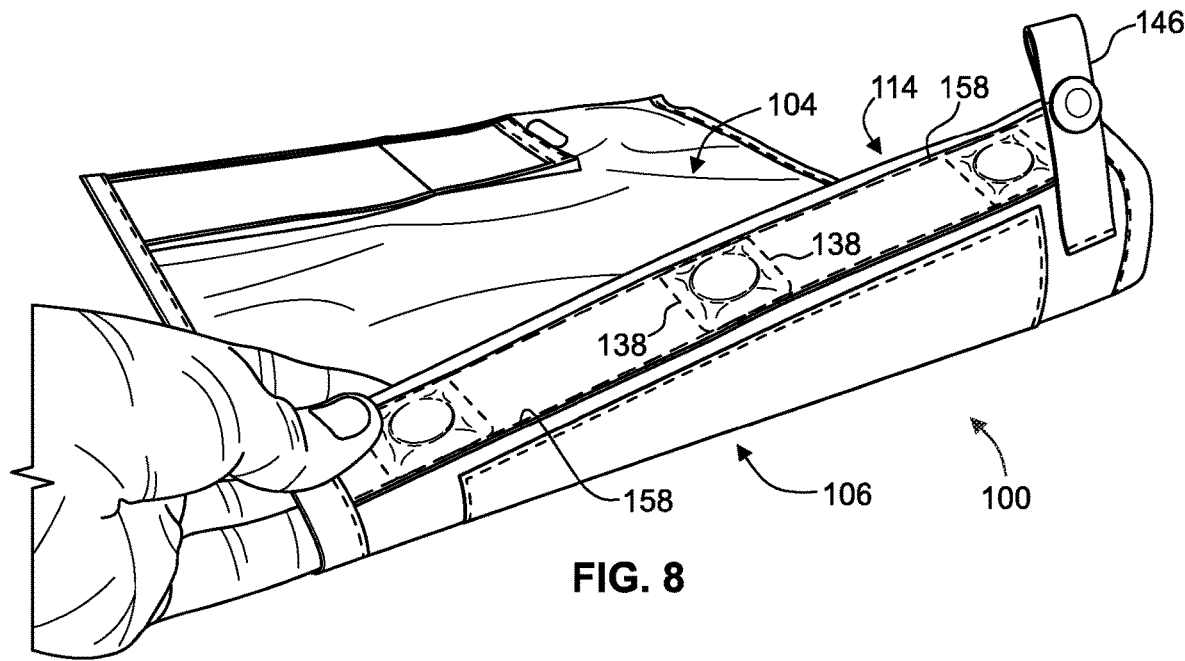
FIG. 8 is a diagrammatic perspective view similar to that of FIG. 6, but wherein the closure section is manually bent upward so as to partially expose the second panel element.
Figure 9:
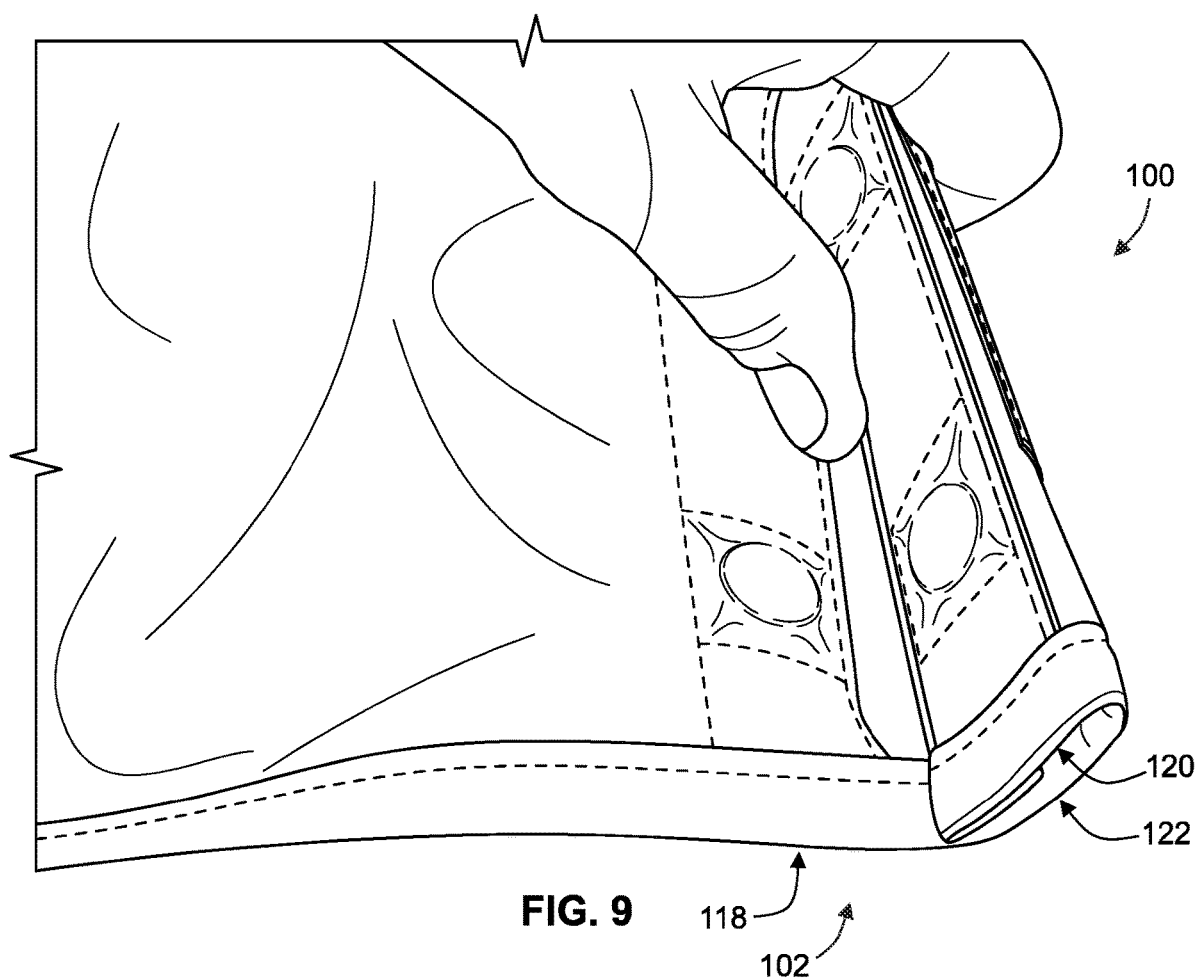
FIG. 9 is a diagrammatic partial perspective view of an example closure section showing the distal flap folded with respect to the intermediate flap segment, and the intermediate flap segment in the process of being folded with respect to the retention segment.

Referring to FIGS. 3 and 7, the first panel element 104 and second panel element 106 may each include an RF-shielding layer 108. In preferred embodiments of the faraday bag 100, the first panel element 104 and/or the second panel element 106 may also comprise an outboard layer 110. The outboard layers 110 may preferably be comprised of a ballistic Nylon or similar material. Preferred embodiments of the panel elements may be connected to one another (e.g., along their peripheries via stitching or adhesive) to define an RF-shielding compartment 112 therebetween and an access mouth 114. The RF-shielding compartment 112 is preferably sufficiently large so as to be capable of receiving and housing therein one or more electronic devices 160 configured to transmit and/or receive RF signals (e.g., a cell phone). The access mouth 114 is preferably sufficiently large so as to allow the aforementioned electric devices 160 to pass therethrough as they are manually inserted into and removed from the RF-shielded compartment 112.

Figure 2:
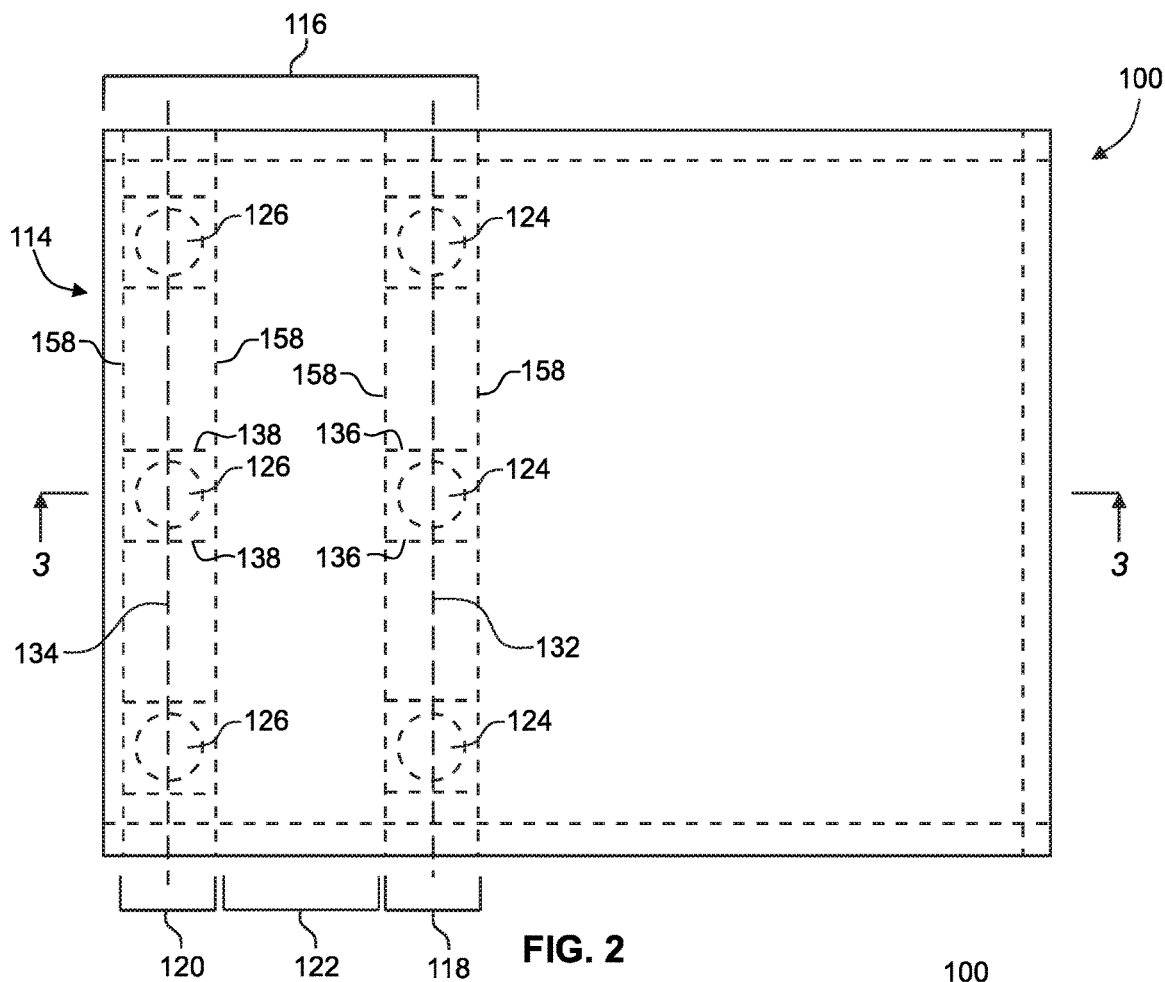
FIG. 2 is a diagrammatic plan view of an example faraday bag in accordance with the present disclosure, wherein the faraday bag is in an open configuration.

The closure section 116 may be defined between the RF-shielding compartment 112 and the access mouth 114. Referring to FIGS. 2 and 3, in certain preferred embodiments of the faraday bag 100, the closure section 116 may include a retention segment 118, a distal flap segment 120, and an intermediate flap segment 122 therebetween. In such embodiments, the distal flap segment 120 may be foldably associated with the intermediate flap segment 122 (see, for example, FIG. 4), and the intermediate flap segment 122 may be foldably associated with the retention segment 118 (see, for example, FIG. 5). The closure section 116 may be selectively actuatable between an open configuration (shown, for example, in FIG. 3) and a closed configuration (shown for example, in FIG. 5). Once the closure section 116 reaches the closed configuration, it is retained there by magnetic engagement between corresponding base and flap magnets until a user manually forces disengagement of these magnets from one another. In certain preferred embodiments of the faraday bag 100, the closure section 116 is devoid of any hook-and-loop fasteners.

Referring to FIGS. 2 and 3, the plurality of base magnets 124 may each be disposed within the first panel element 104 and within the retention segment 118. Similarly, the multiplicity of flap magnets 126 may each be disposed within the second panel element 106 and within the distal flap segment 120. Although the embodiments illustrated in the figures include three base magnets and three flap magnets, other embodiments may be configured to employ a different number of base and flap magnets. The base magnets 124 and flap magnets 126 may preferably be rare-earth magnets, such as neodymium magnets.

Referring again to FIGS. 2 and 3, when the closure section 116 is in the open configuration, the flap magnets 126 are out of attractive magnetic engagement with respective said base magnets 124, and the shielding compartment 112 is accessible from an ambient environment 128 by way of the access mouth 124. In contrast, referring to FIG. 5, when the closure section 116 is in the closed configuration, the distal flap segment 120 is folded with respect to the intermediate flap 122 segment, the intermediate flap segment 122 is folded with respect to the retention segment 118, the flap magnets 126 are in attractive magnetic engagement with respective said base magnets 124, and the access mouth 114 is retained in an RF-sealed configuration (thus restricting or preventing RF signals from entering or exiting the RF-shielded compartment 112 via the access mouth 114).

Figure 14:
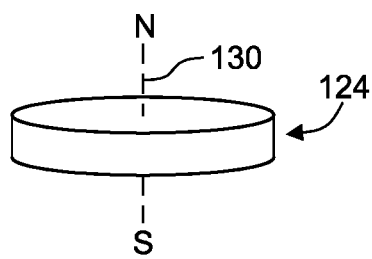
FIG. 14 is a diagrammatic perspective view of an example base magnet with pole axis.

Referring to FIGS. 2 and 14, in particular preferred embodiments of the faraday bag 100, the flap magnets 126 and base magnets 124 are each circular-cylindrical and axially-magnetized along a pole axis 130. Moreover, in preferred such embodiments, when the closure section 116 is in the closed configuration, the pole axis 130 of each flap magnet 126 is axially aligned with the pole axis 130 of a respective said base magnet 124.

Referring to FIGS. 2 and 7, in certain preferred embodiments of the faraday bag 100, the base magnets 124 may be spaced from one another along a base magnet axis 132, and the flap magnets 126 may be spaced from one another along a flap magnet axis 134. In such embodiments, the base magnets 124 may be constrained from movement along the base magnet axis 132 with respect to the first panel element 104, and the flap magnets 126 may be constrained from movement along the flap magnet axis 134 with respect to the second panel element 106. The constraining of the base magnets 124 may be at least in part by way of base lateral stitching 136 extending orthogonally to the base magnet axis. Similarly, the constraining of the flap magnets 126 may be at least in part by way of flap lateral stitching 138 extending orthogonally to the flap magnet axis 134. In certain embodiments of the faraday bag 100, the term "extending orthogonally" may mean that the path of the lateral stitching extends substantially or entirely at a right angle with respect to the respective magnet axis. However, in certain alternate embodiments, the term "extending orthogonally" may mean that the path of the lateral stitching extends in a direction outward from the respective magnet axis, regardless of whether such path is linear, curved or at a right angle with respect to the respective magnet axis.

Figure 5:
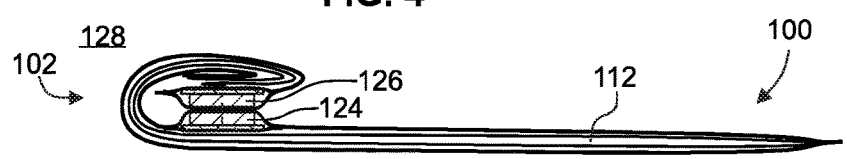
FIG. 5 is a further diagrammatic cross-sectional view taken along lines 3-3 in FIG. 2, but showing the closure section in a closed configuration with the distal flap folded with respect to the intermediate flap segment, the intermediate flap segment folded with respect to the retention segment, and the access mouth retained in an RF-sealed configuration.
Figure 6:
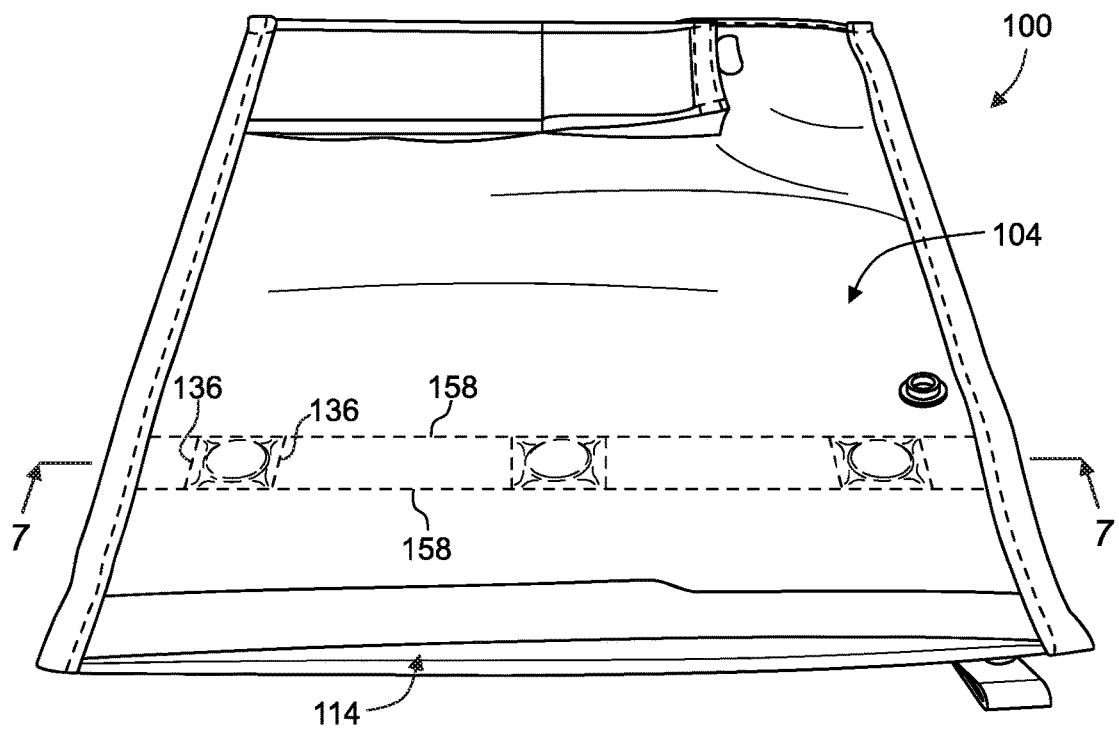
FIG. 6 is a diagrammatic perspective view of the example faraday bag of FIG. 1, with the first panel element facing upward.
Figure 13:
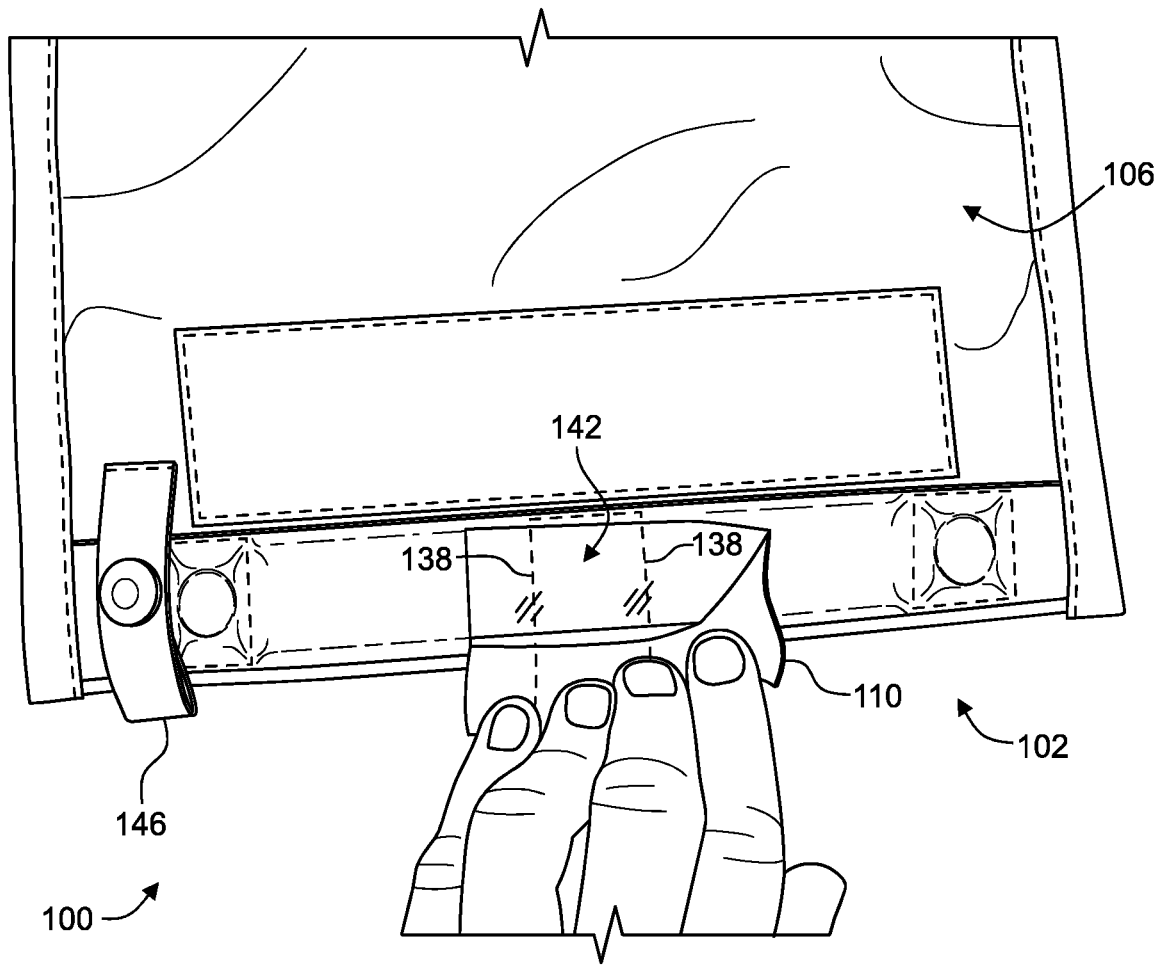
FIG. 13 is a diagrammatic partial view of an example faraday bag in accordance with the present disclosure, wherein the outboard layer of the second panel element is shown partially cut and peeled away, and the center flap magnet removed, thereby exposing a portion of the flap stiffener element thereunder.

Referring to FIGS. 3, 7 and 13, particular preferred embodiments of a faraday bag 100 in accordance with the present disclosure may further comprise a base stiffener element 140 and a flap stiffener element 142. The base stiffener element 140 may be elongated and simultaneously disposed within the first panel element 104, within the retention segment 118, and supportingly adjacent to the base magnets 124. Similarly, the flap stiffener element 142 may be elongated and simultaneously disposed within the second panel element 106, within the distal flap segment 120, and supportingly adjacent to the flap magnets 126. Referring to FIG. 5, the base magnets 124 and flap magnets 126 may be disposed between the base stiffener element 140 and flap stiffener element 142 when the closure section 116 is in the closed configuration. In certain preferred embodiments of the faraday bag 100, the base stiffener element 140 may be in direct contact with the base magnets 124 and the flap stiffener element 142 may be in direct contact with the flap magnets 126.

In particular preferred embodiments, the base stiffener element 140 and/or the flap stiffener element 142 may be comprised of, for example, a polymer strip, and may be flat-planar. Moreover, referring to FIG. 7, the base lateral stitching 136 may extend into the first panel element 104 and through the base stiffener element 140. Similarly, the flap lateral stitching 138 may extend into the second panel element 106 and through the flap stiffener element 142.

Referring to FIGS. 2 and 3, the first panel element 104 may include a first elongated pocket 144 housing the base stiffener element 140. Similarly, the second panel element 106 may include a second elongated pocket 144 housing the flap stiffener element 142. Each elongated pocket 144 may be defined between a respective outboard layer 110 and respective closeout strip 156 connected to one another by respective longitudinal stitching 158. The outboard layer 110 and the closeout strip 156 may preferably be made of a fabric such as ballistic Nylon or the like.

Figure 10:
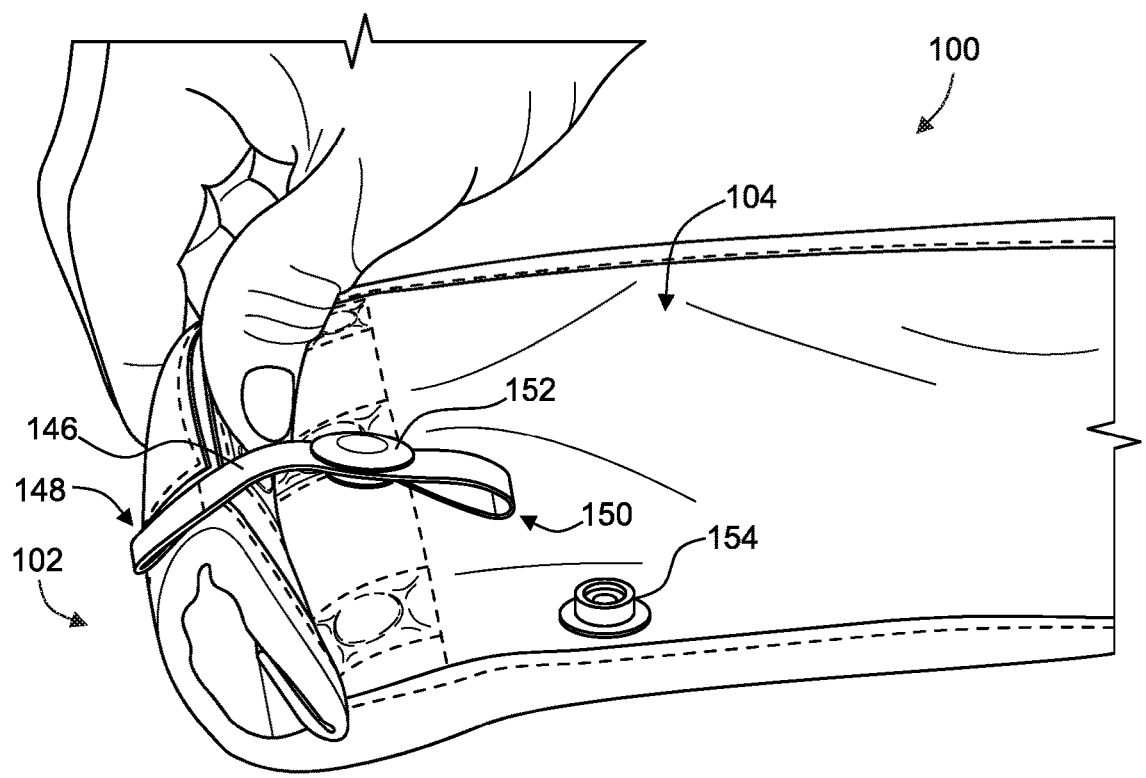
FIG. 10 is a further diagrammatic partial perspective view of an example closure section placed in a configuration similar to that of FIG. 9, but showing an auxiliary securement element with the second end being disengaged from the first panel element.
Figure 11:
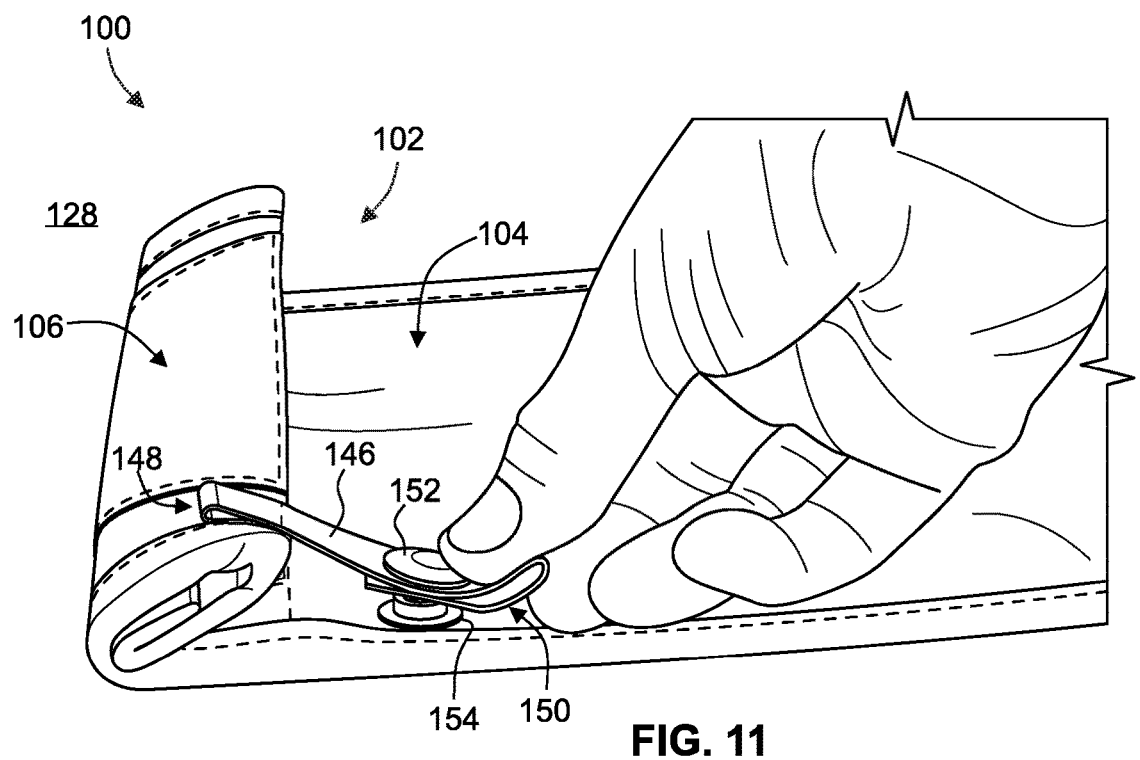
FIG. 11 is a diagrammatic partial perspective view similar to that of FIG. 10, but showing an auxiliary securement element with the second end in engagement with the first panel element.
Figure 12:
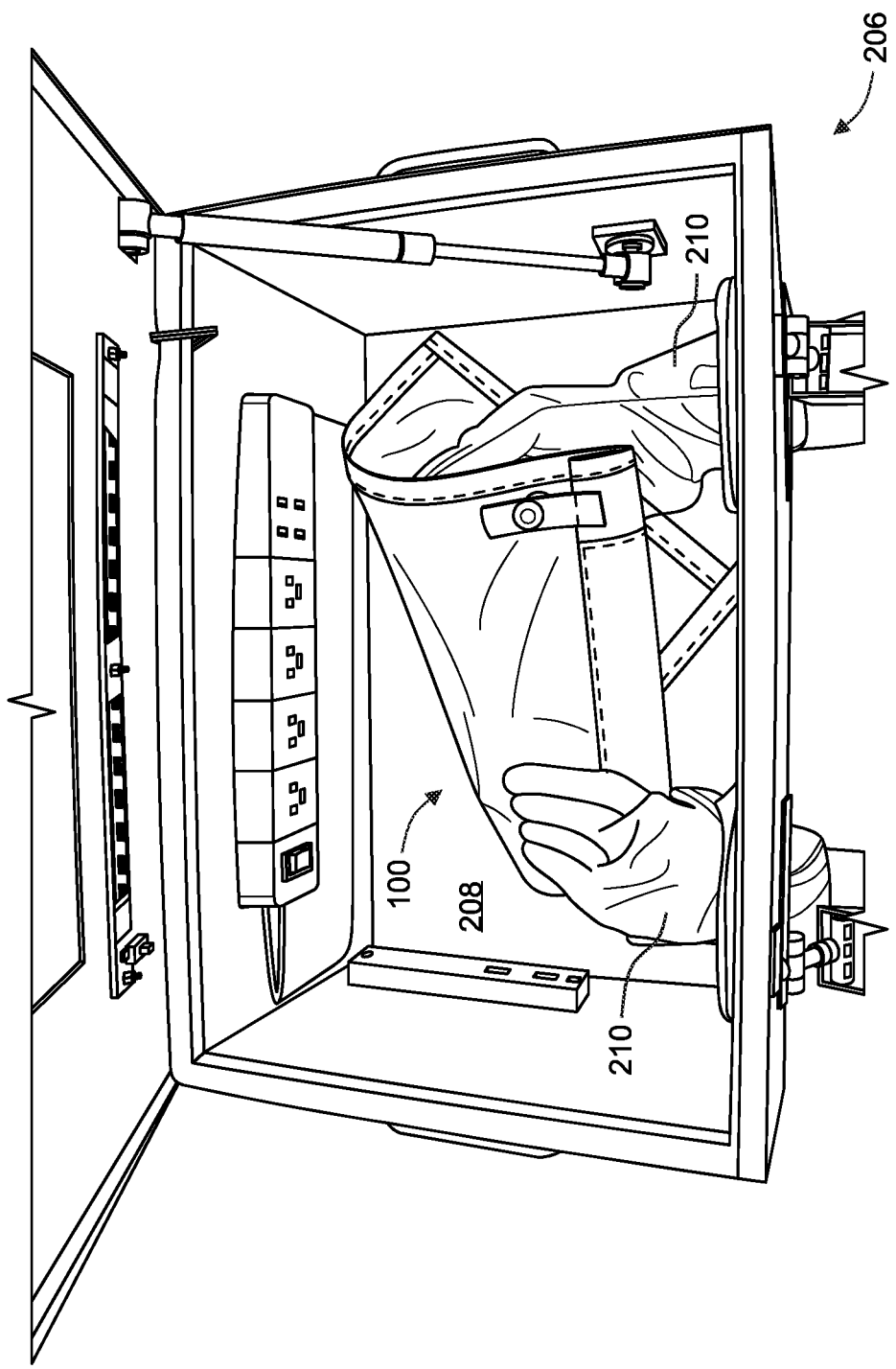
FIG. 12 is a diagrammatic perspective view illustrating an example faraday bag in accordance with the present disclosure being manipulated within a prior art hard-sided RF-shielded enclosure.

Referring to FIGS. 10 and 11, certain preferred embodiments of a faraday bag 100 may further comprise an auxiliary securement element 146 having a first portion 148 affixed to the second panel element 106 (for example, by stitching, rivet or adhesive) and a second portion 150 configured to engage and disengage the first panel element 104. When the second portion 150 is in engagement with the first panel element 104, the auxiliary securement element 146 aids in securing the closure section 116 in the closed configuration. Contrastingly, when the second portion 150 is disengaged from the first panel element 104, the auxiliary securement element 146 does not aid in securing the closure section 116 in the closed configuration. The engagement and disengagement of the second portion 150 may be, for example, by way of mutually-engageable snap or clasp components (see, for example, complementary snap components 152 and 154).

Figure 15:
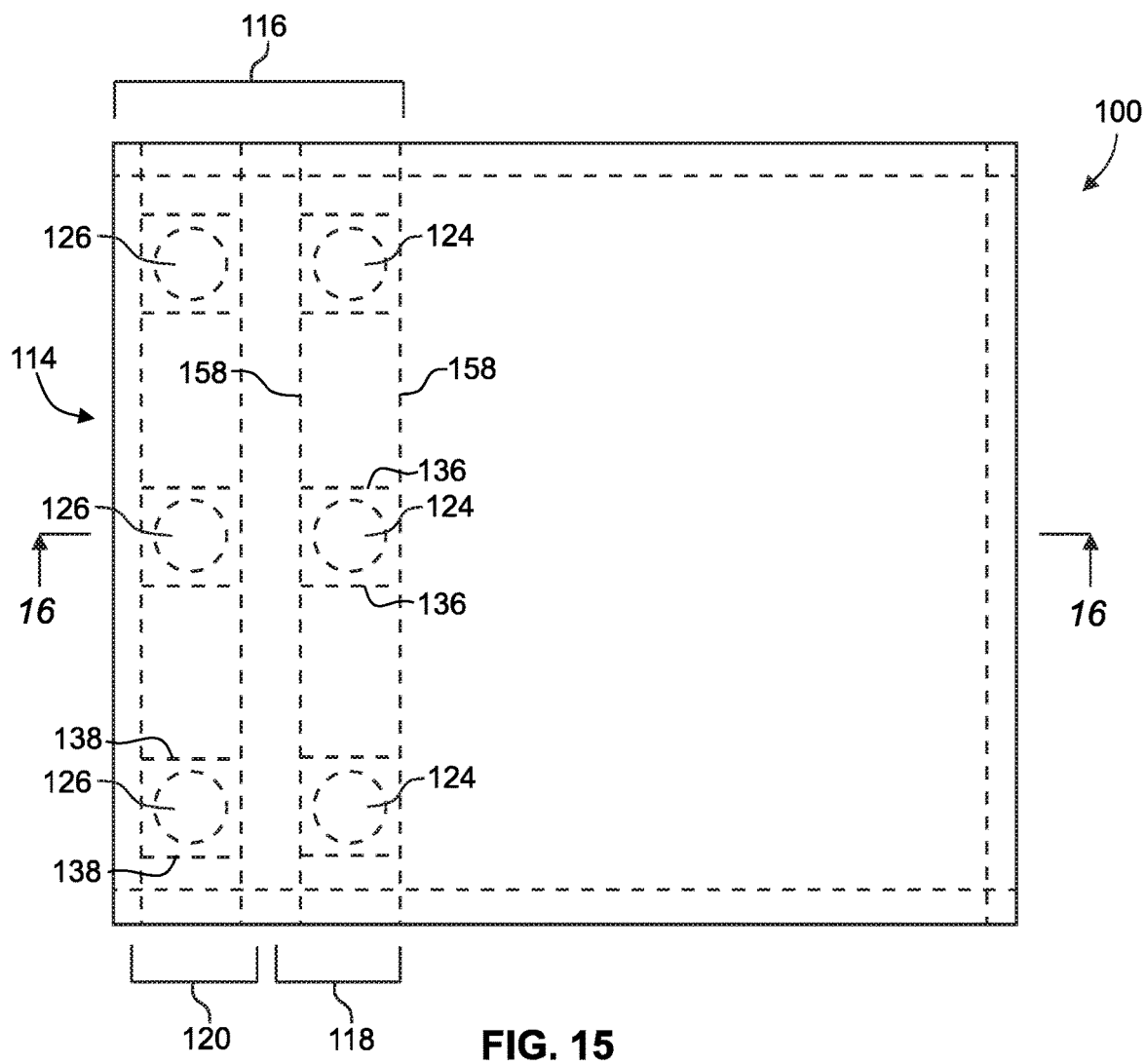
FIG. 15 is a diagrammatic perspective view of an alternate example of a faraday bag in accordance with the present disclosure, wherein the closure section is configured to operate without an intermediate flap segment disposed between the retention segment and the distal flap segment.
Figure 16:
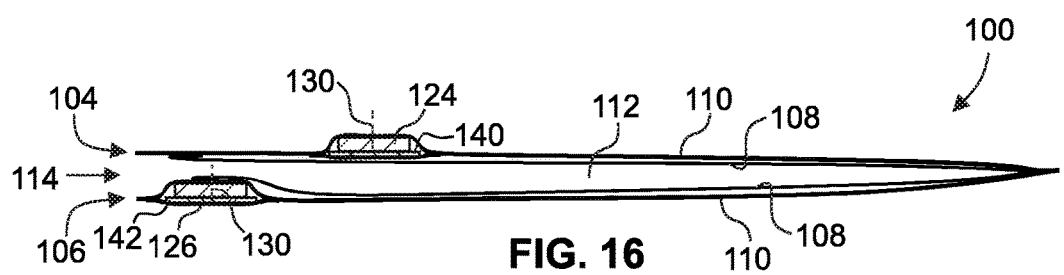
FIG. 16 is a diagrammatic cross-sectional view taken along lines 16-16 in FIG. 15, showing the closure section in an open configuration with the shielding compartment being accessible from (e.g., in communication with) an ambient environment by way of the access mouth.
Figure 17:
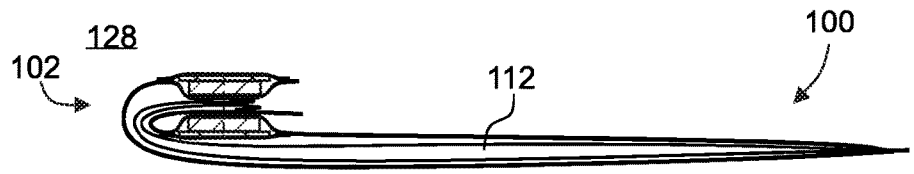
FIG. 17 is a further diagrammatic cross-sectional view taken along lines 16-16 in FIG. 15, but showing the closure section in a closed configuration with the distal flap folded with respect to the retention segment, and the access mouth retained in an RF-sealed configuration.

Referring to FIGS. 15-17, in certain alternate embodiments of a faraday bag 100 with magnetic closure system 102, the closure section 116 may include a retention segment 118 and a distal flap segment 120 being foldably associated with the retention segment 118, and may lack an intermediate flap segment therebetween. In such an embodiment, when the closure section 116 is in the closed configuration, the distal flap segment 120 is folded with respect to the retention segment 118, the flap magnets 126 are in attractive magnetic engagement with respective base magnets 124, and the access mouth is retained in an RF-sealed configuration.

The present disclosure is directed, in large part, to magnetic closure systems and methods which remedy the deficiencies associated with the conventional use of hook-and-loop closures. Implementations of the magnetic closure systems described herein may employ a "roll style" method of rolling (folding) the bag over twice to seal the main RF compartment, and use magnets to retain that seal. The magnets may be sewn in a configuration of two separate strips, which magnetically engage one another when the closure section of the bag is rolled over twice. When the closure section is rolled (folded), the corresponding magnet pairs come together and cause the access mouth of the bag to be sealed. To ensure that the seal does not come unrolled at any time, a safety strap with a button closure may preferably be used.

Those of ordinary skill in the production of bags might use a few methods of production that would differ from the teachings provided in the present disclosure. For example, a person who is somehow provided motivation to implement a magnetic closure may assume that a strip magnet would suffice. Strip magnets, however, lack the strength to keep this type of closure sealed at all times. The sensitive application of the product requires a tighter seal than a strip magnet, and as such, a different solution is required. Accordingly, preferred embodiments of the presently-disclosed faraday bag employ a series of rare earth (e.g., neodymium) magnets instead. This is because neodymium magnets are stronger, and proper sealing of the double roll closure requires a high-strength connection. Conventional manufacturers of bags would likely not be motivated to use this method since the individual magnets must be aligned to the corresponding opposing magnets (precision sewing is more difficult), rare-earth magnets are more expensive than strip magnets, and the closure would be expected to result in seal gaps due to the more "point-to-point" engagement of a series of individual magnets. To allow fewer, spaced-apart, individual magnets to be used without resulting in connection seal gaps at the access mouth, preferred embodiments of the presently-disclosed faraday bag 100 employ a backing strip (also referred to herein as stiffener elements) placed behind each linear set of magnets. When sewn near the respective magnets, this backing strip keeps the full length of the access mouth sealed against the opposing side. Notably, in the preferred embodiments of the faraday bag 100, the magnets have been placed in front of the backing strips, instead of behind. See, for example, FIGS. 3 and 5. Applicant's experimentation has proven this configuration yields a stronger linearly-continuous RF-seal at the access mouth compared to a configuration in which the backing strips end up disposed between the engaged magnets when the closure section is in the closed configuration.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A faraday bag with magnetic closure system, the faraday bag comprising:
   a first panel element and a second panel element each including an RF-shielding layer, the panel elements being connected to one another to define an RF-shielding compartment therebetween and an access mouth;
   a closure section defined between the shielding compartment and the access mouth, the closure section including a retention segment, a distal flap segment, and an intermediate flap segment therebetween, the distal flap segment being foldably associated with the intermediate flap segment, the intermediate flap segment being foldably associated with the retention segment, the closure section being selectively actuatable between an open configuration and a closed configuration;
   a plurality of base magnets each being disposed
      (a) within the first panel element, and
      (b) within the retention segment;
   a multiplicity of flap magnets each being disposed
      (a) within the second panel element, and
      (b) within the distal flap segment;
   a base stiffener element being elongated and disposed
      (a) within the first panel element, and
      (b) within the retention segment; and a flap stiffener element being elongated and disposed
- (a) within the second panel element, and
- (b) within the distal flap segment;

wherein
- (a) when the closure section is in the open configuration
  - (i) the flap magnets are out of attractive magnetic engagement with respective said base magnets, and
  - (ii) the shielding compartment is accessible from an ambient environment by way of the access mouth;
- (b) when the closure section is in the closed configuration
  - (i) the distal flap segment is folded with respect to the intermediate flap segment,
  - (ii) the intermediate flap segment is folded with respect to the retention segment,
  - (iii) the flap magnets are in attractive magnetic engagement with respective said base magnets, and
  - (iv) the access mouth is retained in an RF-sealed configuration;
- (c) the flap magnets and base magnets are each circular-cylindrical and axially-magnetized along a pole axis;
- (d) when the closure section is in the closed configuration, the pole axis of each flap magnet is axially aligned with the pole axis of a respective said base magnet;
- (e) the base magnets are spaced from one another along a base magnet axis;
- (f) the flap magnets are spaced from one another along a flap magnet axis;
- (g) the base magnets are constrained from movement along the base magnet axis with respect to the first panel element;
- (h) the flap magnets are constrained from movement along the flap magnet axis with respect to the second panel element;
- (i) the first panel element includes a first elongated pocket housing the base stiffener element;
- (j) the second panel element includes a second elongated pocket housing the flap stiffener element; and
- (k) each elongated pocket is defined between a respective outboard layer and respective closeout strip connected to one another by respective longitudinal stitching.

* * * * *